United States Patent
Bang et al.

(10) Patent No.: US 10,453,672 B2
(45) Date of Patent: Oct. 22, 2019

(54) DISSOLVED OZONE REMOVAL UNIT, APPARATUS FOR TREATING SUBSTRATE, METHOD OF REMOVING DISSOLVED OZONE, AND METHOD OF CLEANING SUBSTRATE

(71) Applicant: SEMES CO., LTD., Chungcheongnam-do (KR)

(72) Inventors: Byungsun Bang, Seoul (KR); Junhee Youn, Chungcheongnam-do (KR); Kilsung Kwon, Seoul (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 120 days.

(21) Appl. No.: 15/297,728

(22) Filed: Oct. 19, 2016

(65) Prior Publication Data

US 2017/0117137 A1    Apr. 27, 2017

(30) Foreign Application Priority Data

Oct. 27, 2015  (KR) .................... 10-2015-0149307

(51) Int. Cl.
  *B08B 3/14*   (2006.01)
  *H01L 21/02*  (2006.01)
  (Continued)

(52) U.S. Cl.
  CPC .... *H01L 21/02057* (2013.01); *B01D 19/0005* (2013.01); *B08B 3/08* (2013.01);
  (Continued)

(58) Field of Classification Search
  CPC ........ H01L 21/02057; H01L 21/67051; B01D 19/00; B01D 19/0005; B08B 3/08;
  (Continued)

(56) References Cited

U.S. PATENT DOCUMENTS 3,817,956 A * 6/1974 Harianawala ............ C08F 8/00
                                                   525/340
4,639,314 A * 1/1987 Tyer ..................... B01F 3/04262
                                                   210/220

(Continued)

FOREIGN PATENT DOCUMENTS

CN        1297385 A    5/2001
CN        1565981 A    1/2005
(Continued)

OTHER PUBLICATIONS

Office Action issued in corresponding CN Application No. 201610975795.7 dated May 23, 2018.

*Primary Examiner* — Sharidan Carrillo
(74) *Attorney, Agent, or Firm* — Carter, DeLuca & Farrell LLP

(57) ABSTRACT

Disclosed are a dissolved ozone removal unit that removes dissolved ozone from liquid, an apparatus for treating a substrate, a method of removing dissolved ozone, and a method of cleaning a substrate. The method of removing dissolved ozone in liquid includes supplying micro bubbles to the liquid, and allowing dissolved ozone to exit from the liquid by energy or radical ions that are generated while the micro bubbles are dissolved in the liquid.

6 Claims, 10 Drawing Sheets

(51) Int. Cl.
*B01D 19/00* (2006.01)
*B08B 3/08* (2006.01)
*B08B 3/10* (2006.01)
*C02F 1/20* (2006.01)
*H01L 21/67* (2006.01)
*C02F 103/34* (2006.01)

(52) U.S. Cl.
CPC ............... *B08B 3/102* (2013.01); *B08B 3/14* (2013.01); *C02F 1/20* (2013.01); *H01L 21/67051* (2013.01); *C02F 2103/346* (2013.01)

(58) Field of Classification Search
CPC ... B08B 3/102; B08B 3/14; C02F 1/20; C02F 2103/346
See application file for complete search history.

(56) References Cited

U.S. PATENT DOCUMENTS

| | | | |
|---|---|---|---|
| 6,390,456 B1* | 5/2002 | Lee | B01F 3/04269 |
| | | | 210/242.2 |
| 2003/0108823 A1* | 6/2003 | Muraoka | B08B 3/02 |
| | | | 430/329 |
| 2003/0205136 A1* | 11/2003 | McNulty | B01D 19/0005 |
| | | | 95/265 |
| 2008/0223788 A1* | 9/2008 | Rimdzius | A61H 33/06 |
| | | | 210/664 |
| 2009/0008806 A1* | 1/2009 | Lynn | B01F 3/04475 |
| | | | 261/121.1 |
| 2009/0032473 A1* | 2/2009 | Ueki | C02F 1/78 |
| | | | 210/718 |
| 2010/0322844 A1* | 12/2010 | Sanui | C01B 13/11 |
| | | | 423/581 |
| 2017/0117137 A1* | 4/2017 | Bang | B01D 19/0005 |

FOREIGN PATENT DOCUMENTS

| | | |
|---|---|---|
| CN | 1912697 A | 2/2007 |
| CN | 101380525 A | 3/2009 |
| CN | 101381150 A | 3/2009 |
| JP | 3733136 B1 | 1/2006 |
| JP | 2010104860 A | 5/2010 |
| JP | 4910796 B2 | 4/2012 |
| KR | 20020090780 A | 12/2002 |
| KR | 2004002356 A * | 1/2004 |
| KR | 20050035780 A | 4/2005 |
| KR | 10-0716532 B1 | 5/2007 |
| KR | 10-0765409 B1 | 10/2007 |
| KR | 20070113551 A | 11/2007 |
| KR | 2008-0105008 A | 12/2008 |
| KR | 20100029517 A | 3/2010 |
| KR | 20120008104 | 1/2012 |
| KR | 10-1287044 B1 | 7/2013 |
| KR | 2015-0079580 A | 7/2015 |

\* cited by examiner

DISSOLVED OZONE REMOVAL UNIT, APPARATUS FOR TREATING SUBSTRATE, METHOD OF REMOVING DISSOLVED OZONE, AND METHOD OF CLEANING SUBSTRATE

CROSS-REFERENCE TO RELATED APPLICATIONS

A claim for priority under 35 U.S.C. § 119 is made to Korean Patent Application No. 10-2015-0149307 filed Oct. 27, 2015, in the Korean Intellectual Property Office, the entire contents of which are hereby incorporated by reference.

BACKGROUND

Embodiments of the inventive concept described herein relate to The inventive concept relates to a dissolved ozone removal unit that removes dissolved ozone from liquid, an apparatus for treating a substrate, a method of removing dissolved ozone, and a method of cleaning a substrate.

In general, in process of manufacturing flat panel display devices or semiconductors, various processes such as a photoresist coating process, a developing process, an etching process, and an ashing process are performed in a process of treating a glass substrate or a wafer.

In particular, as circuit patterns have rapidly become finer as the semiconductor devices have had high density, high integration, and high performance, contaminants such as particles, organic contaminants, metallic contaminant residing on a surface of a substrate greatly influence the characteristics and yield rate of the devices. Due to this, a cleaning process of removing various contaminants attached to a surface of a substrate is very important, and a process of cleaning a substrate is performed before and after unit processes for manufacturing a semiconductor.

Meanwhile, a treatment liquid used in the cleaning process may include ozone of high density, and dissolved ozone has to be removed from the treatment liquid that has performed a process of treating a substrate.

The method of removing dissolved ozone includes a method of removing dissolved ozone by using a catalyst, a thermal decomposition method, and a method of removing ozone by using ultraviolet rays.

The method of removing dissolved ozone by using a catalyst includes a method of removing dissolved ozone by using a surface of active carbon through a direct reaction of active carbon and ozone. Unlike this, there is a method of decomposing dissolved ozone by using manganese dioxide that is a metal oxide.

The thermal decomposition method is a method of removing dissolved ozone by using a property of ozone, by which ozone is converted to oxygen if heat is applied to the ozone.

The method of using ultraviolet rays may include a method of expediting decomposition of ozone by applying ultraviolet rays to the ozone.

Meanwhile, in the method of removing dissolved ozone by using a catalyst, catalysts have to be periodically replaced due to their limited life spans. Further, the thermal decomposition method and the method using ultraviolet rays consume much electric power because much heat and much energy of ultraviolet rays are provided to an ozone removal apparatus.

SUMMARY

Embodiments of the inventive concept provide a dissolved ozone removal unit that removes dissolved ozone from liquid by using micro bubbles, an apparatus for treating a substrate, a method of removing dissolved ozone, and a method of cleaning a substrate.

The aspect of the inventive concept is not limited thereto, and other unmentioned aspects of the inventive concept may be clearly appreciated by those skilled in the art from the following descriptions.

The inventive concept relates to a method of removing dissolved ozone in liquid.

According to an embodiment, the method may include supplying micro bubbles to the liquid, and allowing dissolved ozone to exit from the liquid by energy or radical ions that are generated while the micro bubbles are dissolved in the liquid.

According to an embodiment, the micro bubbles may be supplied to a lower area in the liquid.

According to an embodiment, the micro bubbles may be generated by rotating liquid containing gases and then be supplied to the liquid containing the dissolved ozone.

According to an embodiment, the micro bubbles may include oxygen.

According to an embodiment, the micro bubbles may include an inert gas.

According to an embodiment, the liquid containing the dissolved oxygen may be water, and the inert gas may include nitrogen, argon, or helium gas.

According to an embodiment, the micro bubbles may have an average size of 50 micrometers or less.

The inventive concept provides a unit for removing dissolved ozone in liquid.

According to an embodiment, the unit may include a container that has a space in which liquid is accommodated, a bubble supply member that supplies micro bubbles into the space, and an exhaust member that is coupled to the container to discharge the dissolved ozone that exits from the liquid.

According to an embodiment, the bubble supply member may be connected to a lower area in the container.

According to an embodiment, the bubble supply member may include a supply pipe that has a passage, through which liquid containing gases flow, therein and is connected to the container, and a bubble generator that is situated in the passage and is rotated to generate the micro bubbles.

According to an embodiment, the supply pipe may be connected to an upper wall of the container and extends to a lower area in the container, and a plurality of supply holes, through which the micro bubbles are supplied, may be formed in the supply pipe situated in the lower area in the container.

According to an embodiment, the exhaust member may include an exhaust pipe connected to the container, and a pressure reduction member that is connected to the exhaust pipe to provide an exhaust pressure to the space.

According to an embodiment, the unit may include a container that includes a space having an upper area in which liquid is accommodated and dissolved ozone in the liquid is removed, and a lower area that generates micro bubbles supplied to the upper area, a bubble supply member that supplies micro bubbles into the upper area, and an exhaust member that is coupled to the container to discharge the dissolved ozone that exits from the liquid, and the bubble supply member may include a supply pipe that has a passage, through which liquid containing gases flow, therein and is connected to the lower area, a supply plate that partitions the space in the container into the upper area and the lower area and has a plurality of holes, and a bubble generator that is situated in the lower area and is rotated to generate the micro bubbles.

According to an embodiment, the micro bubbles may include oxygen.

According to an embodiment, the micro bubbles may include an inert gas.

According to an embodiment, the micro bubbles may have an average size of 50 micrometers or less.

The inventive concept provides a method for cleaning a substrate.

According to an embodiment, the method may include supplying a cleaning liquid to the substrate to clean the substrate, and removing dissolved ozone in the cleaning liquid after cleaning the substrate, and the removing of the dissolved ozone may include supplying micro bubbles to the cleaning liquid, and removing the dissolved ozone with energy or radical ions generated while the micro bubbles are dissolved in the liquid.

According to an embodiment, the micro bubbles may be generated by rotating liquid containing gases and then be supplied to the liquid containing the dissolved ozone.

According to an embodiment, the micro bubbles may include oxygen or an inert gas.

According to an embodiment, the liquid containing the dissolved oxygen may be water, and the inert gas may include nitrogen, argon, or helium gas.

According to an embodiment, the micro bubbles may have an average size of 50 micrometers or less.

The inventive concept provides an apparatus for treating a substrate.

According to an embodiment, the apparatus may include a housing, a cup that is situated in the interior of the housing and has a treatment space, a support unit that is situated in the treatment space to support the substrate, a liquid supply unit that supplies a cleaning liquid to a substrate positioned on the support unit, and a dissolved ozone removal unit that removes dissolved ozone in the cleaning liquid that is recovered after a process of cleaning a substrate, and the removing of the dissolved ozone may include a container that has a space in which liquid is accommodated, a supply member that supplies micro bubbles into the space, and an exhaust member that is coupled to the container to discharge the dissolved ozone that exits from the liquid.

According to an embodiment, the bubble supply member may be connected to a lower area in the container.

According to an embodiment, the bubble supply member may include a supply pipe that has a passage, through which liquid containing gases flows, therein and is connected to the container, and a bubble generator that is situated in the passage and is rotated to generate the micro bubbles.

According to an embodiment, the supply pipe may be connected to an upper wall of the container and extend to a lower area in the container, and a plurality of supply holes, through which the micro bubbles are supplied, may be formed in the supply pipe situated in the lower area in the container.

According to an embodiment, the exhaust member may include an exhaust pipe connected to the container, and a pressure reduction member that is connected to the exhaust pipe to provide an exhaust pressure to the space.

According to an embodiment, the micro bubbles may include oxygen or an inert gas.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, exemplary embodiments of the inventive concept will be described in more detail with reference to the accompanying drawings. The embodiments of the inventive concept may be modified in various forms, and the scope of the inventive concept should not be construed to be limited to the following embodiments. The embodiments of the inventive concept are provided to describe the inventive concept for those skilled in the art more completely. Accordingly, the shapes of the components of the drawings are exaggerated to emphasize clearer description thereof.

Figure 1:
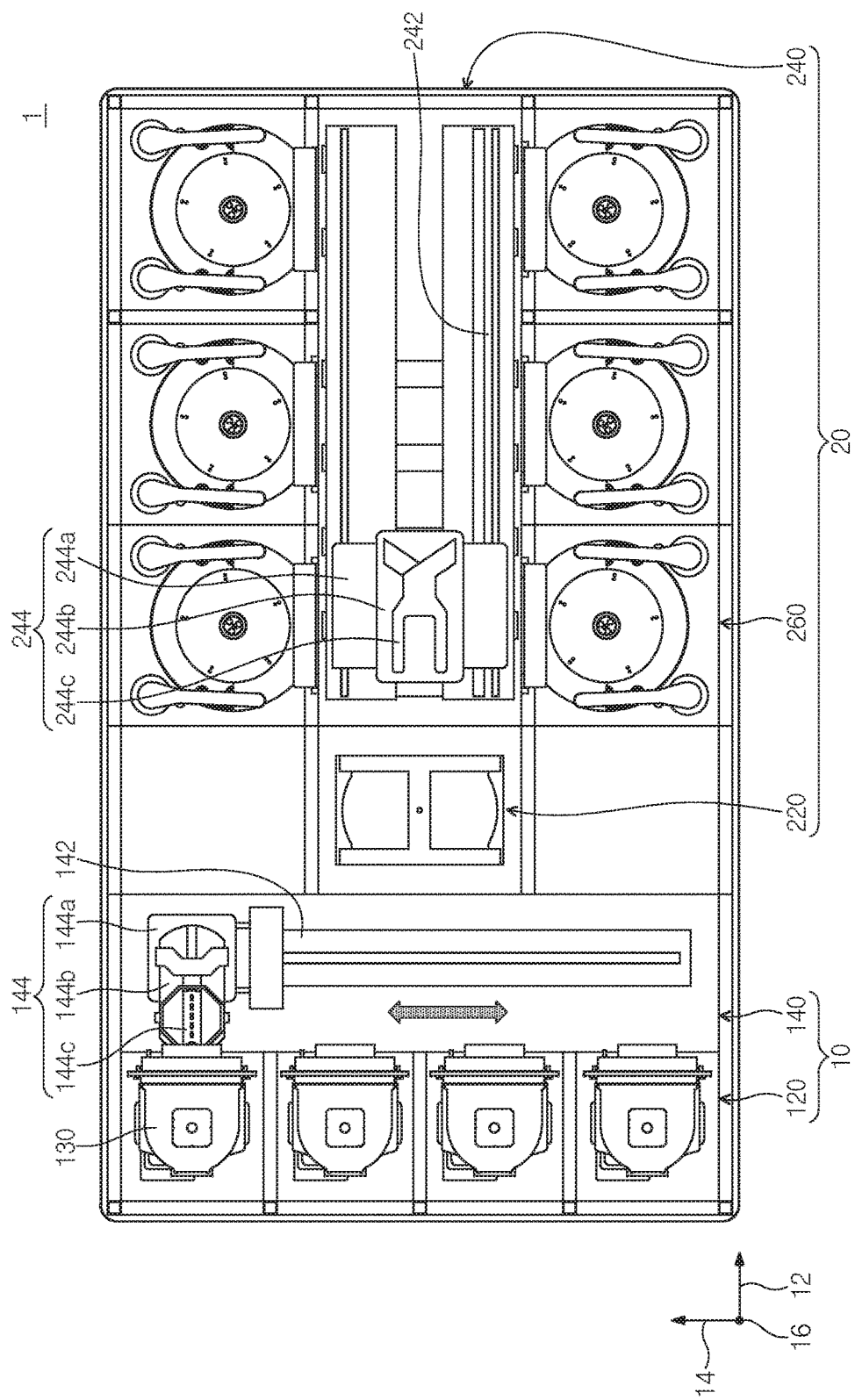
FIG. 1 is a plan view illustrating a substrate treating system according to an embodiment of the inventive concept.

FIG. 1 is a plan view illustrating a substrate treating system according to an embodiment of the inventive concept. Referring to FIG. 1, the substrate treating system 1 includes an index module 10 and a process executing module 20. The index module 10 includes a plurality of load ports 120 and a feeding frame 140. The load port 120, the feeding frame 140, and the process treating module 20 may be sequentially arranged in a row. Hereinafter, a direction in which the load port 120, the feeding frame 140, and the process treating module 20 will be referred to a first direction 12. A direction perpendicular to the first direction 12 when viewed from the top will be referred to as a second direction 14, and a direction normal to a plane including the first direction 12 and the second direction 14 will be referred to as a third direction 16.

A carrier 130, in which a substrate W is received, is seated on the load port 120. A plurality of load ports 120 are provided, and are arranged along the second direction 14 in a row. FIG. 1 illustrates that four load ports 120 are provided. However, the number of the load ports 120 may increase or decrease according to a condition, such as the process efficiency of the process treating module 20 or a footprint. A plurality of slots (not illustrated) provided to support peripheries of substrates W are formed in the carrier 130. A plurality of slots are provided along the third direction 16, and the substrate W is situated in the carrier 130 such that the substrates W are stacked to be spaced apart from each other along the third direction 16. A front opening unified pod (FOUP) may be used as the carrier 130.

The process treating module 20 includes a buffer unit 220, a feeding chamber 240, and a plurality of process chambers 260. The feeding chamber 240 is arranged such that the lengthwise direction thereof is in parallel to the first direction 12. The process chambers 260 are arranged on opposite sides of the feeding chamber 240 along the second direction 14. The process chambers 260 situated on one side of the feeding chamber 240 and the process chambers 260 situated on an opposite side of the feeding chamber 240 are symmetrical to each other with respect to the feeding chamber 240. Some of the process chambers 260 are arranged along the lengthwise direction of the feeding chamber 240. Furthermore, some of the process chambers 260 are arranged to be stacked on each other. That is, the process chambers 260 having an array of A by B (A and B are natural numbers) may be arranged on one side of the feeding chamber 240. Here, A is the number of the process chambers 260 provided in a row along the first direction 12, and B is the number of the process chambers 260 provided in a row along the third direction 16. When four or six process chambers 260 are provided on one side of the feeding chamber 240, the process chambers 260 may be arranged in an array of 2 by 2 or 3 by 2. The number of the process chambers 260 may increase or decrease. Unlike the above-mentioned description, the process chambers 260 may be provided only on one side of the feeding chamber 240. Further, unlike the above-mentioned description, the process chambers 260 may be provided on one side or opposite sides of the feeding chamber 240 to form a single layer.

A buffer unit 220 is arranged between the feeding frame 140 and the feeding chamber 240. The buffer unit 220 provides a space in which the substrates W stay before being transported, between the feeding chamber 240 and the feeding frame 140. Slots (not illustrated) in which the substrates W are positioned are provided in the buffer unit 220, and a plurality of slots (not illustrated) are provided to be spaced apart from each other along the third direction 16. Faces of the buffer unit 220 that faces the feeding frame 140 and faces the feeding chamber 240 are opened.

The feeding frame 140 transports the substrates W between the carrier 130 seated on the load port 120 and the buffer unit 220. An index rail 142 and an index robot 144 are provided in the feeding frame 140. The index rail 142 is arranged such that the lengthwise direction thereof is in parallel to the second direction 14. The index robot 144 is installed on the index rail 142, and is linearly moved in the second direction 14 along the index rail 142. The index robot 144 has a base 144a, a body 144b, and a plurality of index arms 144c. The base 144a is installed to be moved along the index rail 142. The body 144b is coupled to the base 144a. The body 144b is provided to be moved along the third direction 16 on the base 144a. The body 144b is provided to be rotated on the base 144a. The index arms 144c are coupled to the body 144b, and are provided to be moved forwards and rearwards with respect to the body 144b. A plurality of index arms 144c are provided to be driven individually. The index arms 144c are arranged to be stacked so as to be spaced apart from each other along the third direction 16. Some of the index arms 144c are used when the substrates W are transported to the carrier 130 in the process treating module 20, and some of the index arms 144c may be used when the substrates W are transported from the carrier 130 to the process treating module 20. This structure may prevent particles generated from the substrates W before the process treatment from being attached to the substrates W after the process treatment in the process of carrying the substrates W in and out by the index robot 144.

The feeding chamber 240 transports the substrates W between the buffer unit 220 and the process chambers 260, and between the process chambers 260. A guide rail 242 and a main robot 244 are provided in the feeding chamber 240.

The guide rail 242 is arranged such that the lengthwise direction thereof is in parallel to the first direction 12. The main robot 244 is installed on the guide rail 242, and is linearly moved along the first direction 12 on the guide rail 242. The main robot 244 has a base 244a, a body 244b, and a plurality of main arms 244c. The base 244a is installed to be moved along the guide rail 242. The body 244b is coupled to the base 244a. The body 244b is provided to be moved along the third direction 16 on the base 244a. The body 244b is provided to be rotated on the base 244a. The main arms 244c are coupled to the body 244b, and are provided to be moved forwards and rearwards with respect to the body 244b. A plurality of main arms 244c are provided to be driven individually. The main arms 244c are arranged to be stacked so as to be spaced apart from each other along the third direction 16. The main arms 244c used when the substrates W are transported from the buffer unit 220 to the process chambers 260 and the main arms 244c used when the substrates W are transported from the process chambers 260 to the buffer unit 220 may be different.

Substrate treating apparatuses 300 that perform cleaning processes on the substrates W are provided in the process chambers 260. The substrate treating apparatuses 300 provided in the process chambers 260 may have different structures according to the types of performed cleaning processes. Selectively, the substrate treating apparatuses 300 in the process chambers 260 may have the same structure. Selectively, the process chambers 260 may be classified into a plurality of groups such that the structures of the substrate treating apparatuses 300 in the process chambers 260 pertaining to the same group are the same and the structures of the substrate treating apparatuses 300 in the process chambers 260 pertaining to different groups are different. For example, when the process chambers 260 are classified into two groups, the first group of process chambers 260 may be provided on one side of the feeding chamber 240 and the second group of process chambers 260 may be provided on an opposite side of the feeding chamber 240. Selectively, the first group of process chambers 260 may be provided on the lower side of the feeding chamber 240 and the second group of process chambers 260 may be provided on the upper side of the feeding chamber 240, on opposite sides of the feeding chamber 240. The first group of process chambers 260 and the second group of process chambers 260 may be classified according to the kinds of the used chemicals or the types of cleaning methods.

Figure 2:
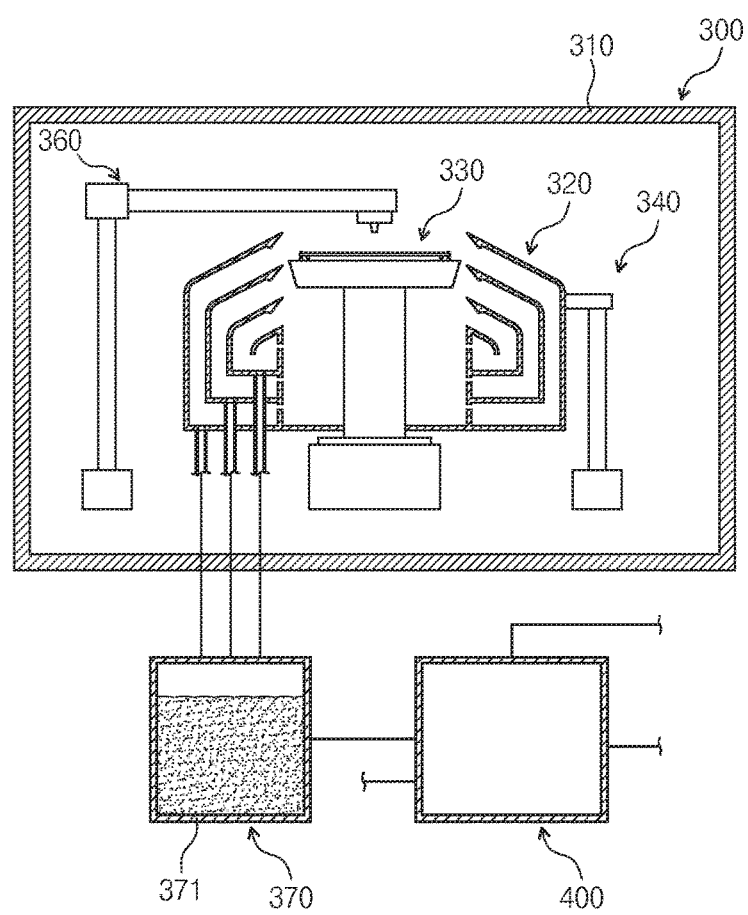
FIG. 2 is a view schematically illustrating a configuration of the substrate treating system provided in a process chamber of FIG. 1.
Figure 3:
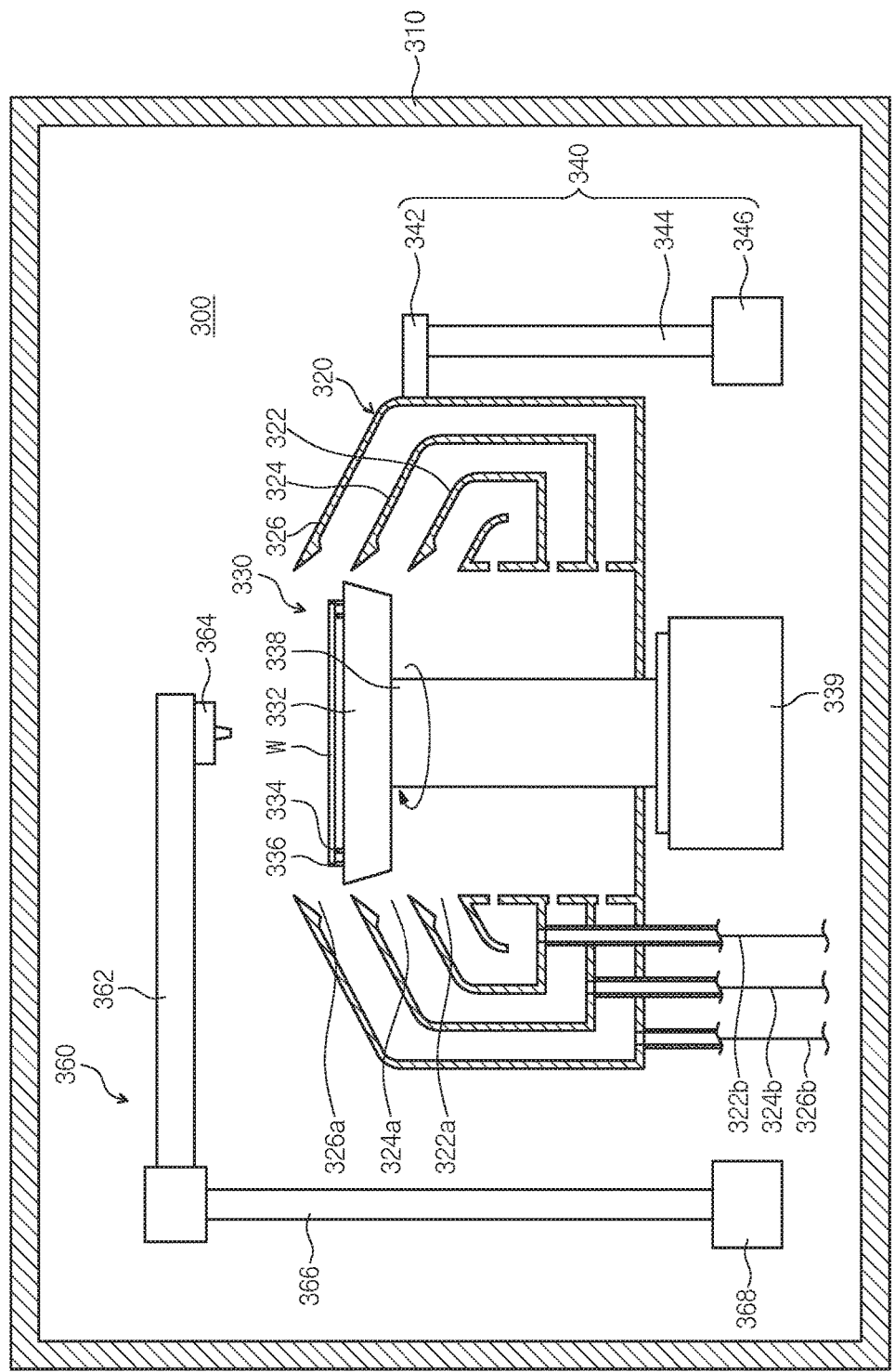
FIG. 3 is a sectional view illustrating the substrate treating apparatus provided in the process chamber of FIG. 1.

Hereinafter, an example of a substrate treating apparatus 300 that cleans a substrate W by using a treatment liquid will be described. FIG. 2 is a view schematically illustrating a configuration of the substrate treating system provided in a process chamber of FIG. 1. FIG. 3 is a sectional view illustrating the substrate treating apparatus provided in the process chamber of FIG. 1. Referring to FIGS. 2 and 3, the substrate treating apparatus 300 includes a housing 310, a cup 320, a support unit 330, an elevation unit 340, a liquid supply unit 360, a liquid recovery unit 370, and a dissolved ozone removal unit 400.

The housing 310 provides a space in the interior thereof. The cup 320 is situated in the interior of the housing 310.

The cup 320 provides a space in which a substrate treating process is performed. The upper side of the cup 320 is opened. The cup 320 has an inner recovery vessel 322, an intermediate recovery vessel 324, and an outer recovery vessel 326. The recovery vessels 322, 324, and 326 recover different treatment liquids used in the process. The inner recovery vessel 322 is provided to have an annular ring shape that surrounds the support unit 330. The intermediate recovery vessel 324 is provided to have an annular ring shape that surrounds the inner recovery vessel 322. The outer recovery vessel 326 is provided to have an annular ring shape that surrounds the intermediate recovery vessel 324. An inner space 322a of the inner recovery vessel 322, a space 324a between the inner recovery vessel 322 and the intermediate recovery vessel 324, and a space 326a between the intermediate recovery vessel 324 and the outer recovery vessel 326 function as inlets through which the treatment liquids are introduced into the inner recovery vessel 322, the intermediate recovery vessel 324, and the outer recovery vessel 326. Recovery lines 322b, 324b, and 326b extending from the recovery vessels 322, 324, and 326 perpendicularly in the downward direction of the bottom surfaces thereof are connected to the recovery vessels 322, 324, and 326, respectively. The recovery lines 322b, 324b, and 326b discharge the treatment liquids introduced through the recovery vessels 322, 324, 326, respectively. The discharged treatment liquids may be reused through an external treatment liquid recycling system (not illustrated).

The support unit 330 is arranged in the cup 320. The support unit 330 supports and rotates the substrate W during the substrate treating process. The support unit 330 includes a body 332, a plurality of support pins 334, a plurality of chuck pins 336, and a support shaft 338. The body 332 has an upper surface having a substantially circular shape when viewed from the top. The support shaft 338 that may be rotated by a motor 339 is fixedly coupled to the bottom of the body 332. A plurality of support pins 334 are provided. The support pins 334 may be arranged to be spaced apart from each other by a specific interval at a periphery of the upper surface of the body 332 and protrude upwards from the body 332. The support pins 334 are arranged to have a generally annular ring shape through combination thereof. The support pins 334 support a periphery of a rear surface of the substrate W such that the substrate W is spaced apart from the upper surface of the body 332 by a predetermined distance.

A plurality of chuck pins 336 are provided. The chuck pins 336 are arranged to be more distant from the center of the body 332 than the support pins 334. The chuck pins 336 are provided to protrude upwards from the body 332. The chuck pins 336 support a side of the substrate W such that the substrate W is not separated laterally from a proper place when the support unit 330 is rotated. The chuck pins 336 are provided to be linearly moved between a standby position and a support position along a radial direction of the body 332. The standby position is a position that is more distant from the center of the body 332 than the support position. When the substrate W is loaded on or unloaded from the support unit 330, the chuck pins 336 are located at the standby position, and when a process is performed on the substrate, the chuck pins 336 are located at the support position. The chuck pins 336 are in contact with the side of the substrate at the support position.

The elevation unit 340 linearly moves the cup 320 upwards and downwards. When the cup 320 is moved upwards and downwards, a relative height of the cup 320 to the support unit 330 is changed. The elevation unit 340 has a bracket 342, a movable shaft 344, and a driver 346.

The bracket 342 is fixedly installed on an outer wall of the cup 320. The movable shaft 344 that is moved upwards and downwards by the driver 346 is fixedly coupled to the bracket 342. The cup 320 is lowered such that, when the substrate W is positioned on the support unit 330 or is lifted from the support unit 330, the support unit 330 protrudes to the upper side of the cup 320. When the process is performed, the height of the cup 320 is adjusted such that the treatment liquid is introduced into the preset recovery vessel 322,324,326 according to the kind of the treatment liquid supplied to the substrate W.

For example, the substrate W is located at a height corresponding to an interior space 322a of the inner recovery vessel 322 while the substrate W is treated by a first treatment fluid. Further, the substrate W may be located at a height corresponding to a space 324a between the inner recovery vessel 322 and the intermediate recovery vessel 324 and a space 326a between the intermediate recovery vessel 324 and the outer recovery vessel 326 while the substrate W is treated by a second treatment liquid and a third treatment liquid. Unlike those described above, the elevation unit 340 may move the support unit 330, instead of the cup 320, upwards and downwards.

The liquid supply unit 360 supplies a treatment liquid to the substrate W during a process of treating the substrate W. The liquid supply unit 360 has a nozzle support 362, a nozzle 364, a support shaft 366, and a driver 368.

The lengthwise direction of the support shaft 366 is provided along the third direction 16, and the driver 368 is coupled to a lower end of the support shaft 366. The driver 368 rotates and elevates the support shaft 366. The nozzle support 362 is vertically coupled to an end opposite to an end of the support shaft 368 coupled to the driver 366. The nozzle 364 is installed on a bottom surface of an end of the nozzle support 382. The nozzle 364 is moved to a process location and a standby location by the driver 368. The process location is a location at which the nozzle 364 is arranged at a vertical upper portion of the cup 320, and the standby location is a location that deviates from the vertical upper portion of the cup 320. The nozzle unit 364 supplies the treatment liquid onto the substrate W.

One or a plurality of liquid supply units 360 may be provided. When a plurality of liquid supply units 360 are provided, a chemical, a rinsing liquid, or an organic solvent may be provided through different liquid supply units 360. The rinsing liquid may be pure water, and the organic solvent may be isopropyl alcohol vapor and a mixture of inert gases or an isopropyl alcohol liquid.

The liquid recovery unit 370 recovery the liquid after the substrate W is treated by supplying the liquid to the substrate W. The liquid recovery unit 371 includes a recovery container 371. The recovery container 371 has a cylindrical shape. The recovery container 371 may store the liquid that treated the substrate W.

Figure 4:
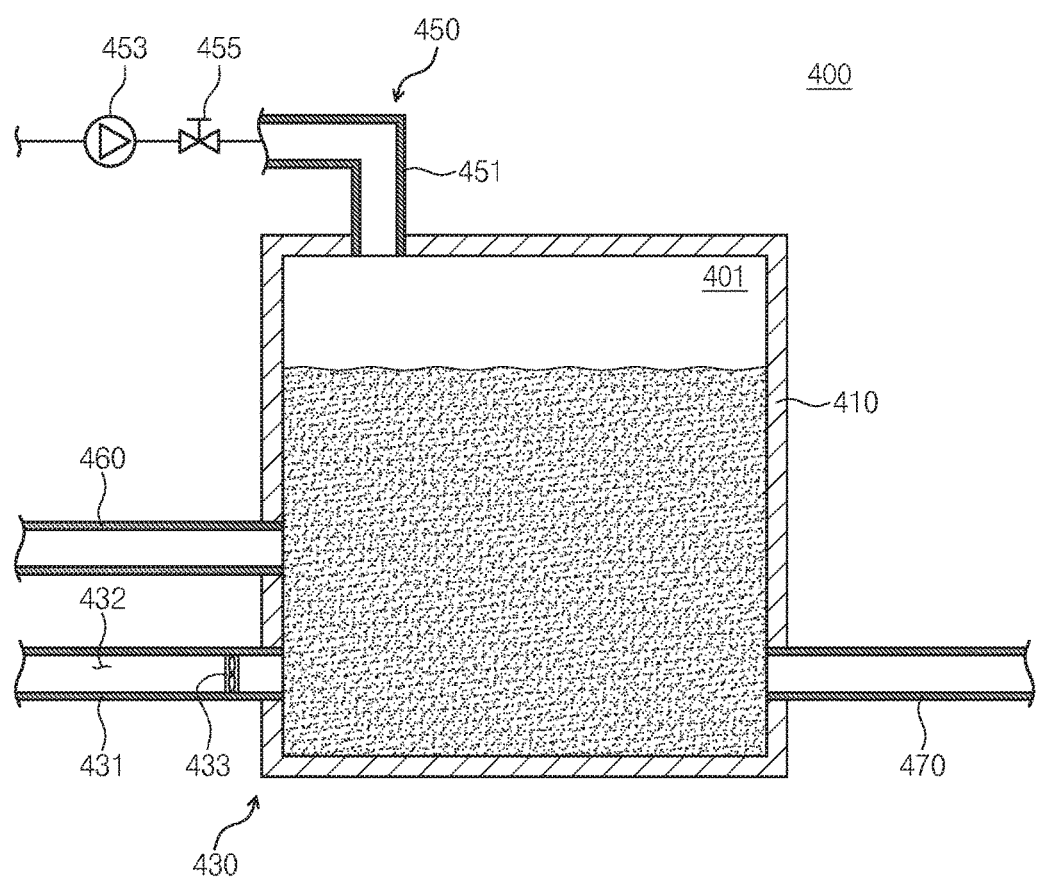
FIG. 4 is a sectional view illustrating the dissolved ozone removing unit of FIG. 2.

FIG. 4 is a sectional view illustrating the dissolved ozone removing unit of FIG. 2. Hereinafter, referring to FIG. 4, the dissolved ozone removal unit 400 may remove dissolved ozone ($O_3$) from the liquid. The dissolved ozone removal unit 400 may supply micro bubbles B to the liquid to remove dissolved ozone $O_3$ in the liquid. For example, the liquid may be water.

The dissolved ozone removal unit 400 includes a container 410, a bubble supply member 430, an exhaust member 450, an inlet pipe 460, and an outlet pipe 470.

The container 410 has a space 401 in which liquid is accommodated. When viewed from the top, the container 410 has a circular shape. The container 410 may have a cylindrical shape. In the space 401 of the container 410, dissolved ozone $O_3$ in the liquid may be removed.

The bubble supply member 430 supplies micro bubbles B into the space 401. The bubble supply member 430 is connected to a lower area in the container 410. The bubble supply member 430 generates micro bubbles B to supply the generated micro bubbles into the space 401 of the container

410. The bubble supply member 430 includes a supply pipe 431 and a bubble generator 433.

The supply pipe 431 is connected to a lower side of a side surface of the container 410. A passage 432 is formed in the interior of the supply pipe 431. The liquid containing gases flows through the passage 432. The passage 432 has a circular cross-section. The passage 432 is connected to the space 401 of the container 410.

The bubble generator 433 generates micro bubbles B. The bubble generator 433 is situated in the passage 432. The bubble generator 433 generates micro bubbles B by rotating the liquid flowing in the passage 432 at high speed. As an example, the bubble generator 433 may be an apparatus that may be rotated at high speed and has a propeller. The micro bubbles B generated by the bubble generator 433 are supplied to a lower area in the container 410 via the passage 432 in the supply pipe 431.

As an example, the micro bubbles B generated by the bubble generator 433 may be oxygen gas. In contrast, the micro bubbles B may be an inert gas. As an example, the inert gas may be nitrogen gas, argon gas, or helium gas. The micro bubbles B generated by the bubble generator 433 may have a size of 50 micrometers or less.

The exhaust member 450 discharges the dissolved ozone $O_3$ exiting from the interior of the liquid to the outside. The exhaust gas 450 is coupled to an upper side of the container 410. The exhaust member 450 includes an exhaust pipe 451 and a pressure reduction member 453.

The exhaust pipe 451 is coupled to an upper side of the container 410. The exhaust pipe 451 is connected to the pressure reduction member 453. The exhaust pipe 451 discharges the dissolved ozone $O_3$ in the interior of the container 410 to the outside. A valve 455 may be installed in the exhaust pipe 451. The valve 455 opens the exhaust pipe 451 during an exhaust operation.

The pressure reduction member 453 provides a pressure to the space 401 of the container 410. For example, the pressure reduction member 453 may be a pump. The pressure reduction member 453 provides an exhaust pressure to the interior of the container 410 to discharge the dissolved ozone $O_3$ removed from the liquid to the outside.

The inlet pipe 460 introduces the liquid into the container 410. The inlet pipe 460 is connected to a side wall of the container 410. As an example, the introduction pipe 460 may be situated above the supply pipe 431.

The outlet pipe 470 discharges the liquid, from which the dissolved ozone $O_3$ is removed, to the outside. The outlet pipe 470 is connected to a side wall of the container 410. The liquid discharged from the outlet pipe 470 may flow to the liquid recovery unit 371.

Figure 5:
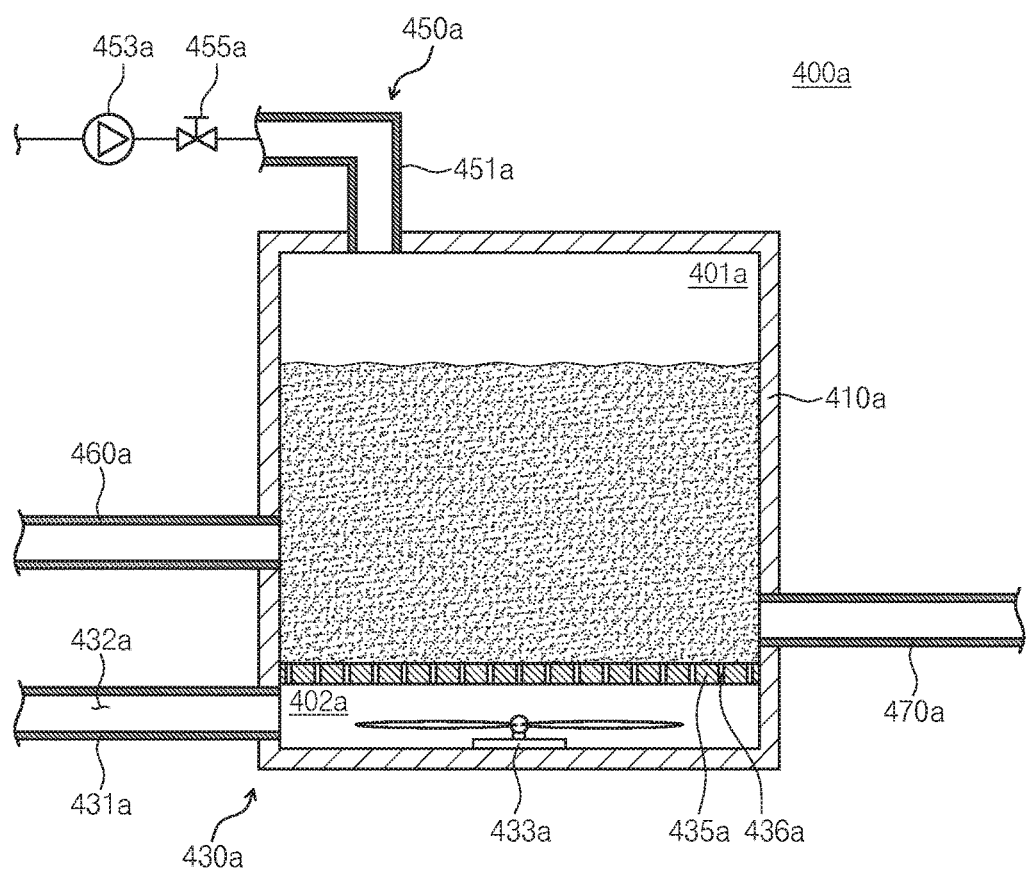
FIGS. 5 and 6 are views illustrating another embodiment of the dissolved ozone removal unit of FIG. 2.
Figure 6:
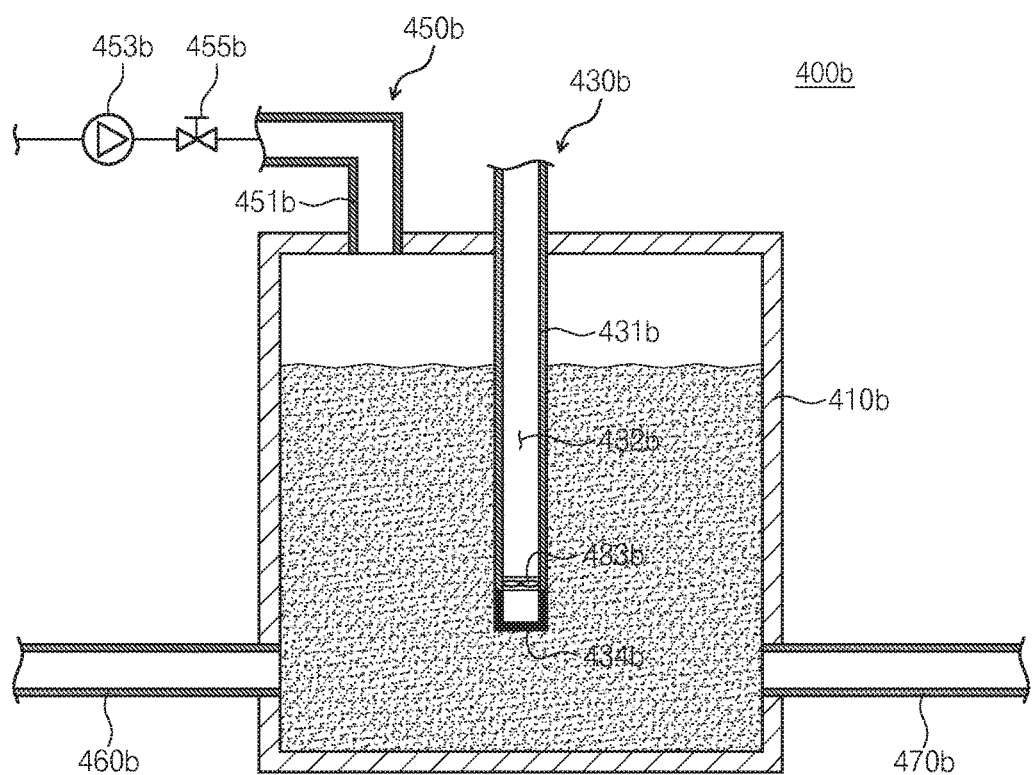

FIGS. 5 and 6 are views illustrating another embodiment of the dissolved ozone removal unit of FIG. 2. The dissolved ozone removal unit 400a includes a container 410a, a bubble supply member 430a, an exhaust member 450a, an inlet pipe 460a, and an outlet pipe 470a. The exhaust member 450a, the inlet pipe 460a, and the outlet pipe 470a of the dissolved ozone removal unit 400a of FIG. 5 are substantially the same as the exhaust member 450, the inlet pipe 460, and the outlet pipe 470 of the dissolved ozone removal unit 400 of FIG. 4.

The container 410a has spaces 401a and 402a in the interior thereof. When viewed from the top, the container 410a has a circular shape. The container 410a may have a cylindrical shape. The space in the interior of the container 410a may include an upper area 401a and a lower area 402a. Liquid is accommodated in the upper area 401a. In the upper area 401a, dissolved ozone $O_3$ in the liquid may be removed. The lower area 402a is situated on a lower side of the upper area 401a. Micro bubbles B are generated in the lower area 402a, and the generated micro bubbles B are supplied by the lower area 402a to the upper area 401a.

The bubble supply member 430a supplies the micro bubbles B to the upper area 401a. The bubble supply member 430a includes a supply pipe 431a, a supply plate 435a, and a bubble generator 433a.

The supply pipe 431a supplies liquid containing gases to the lower area 402a. The supply pipe 431a has a passage 432a in the interior thereof. The supply pipe 431a is connected to a lower side of a side surface of the container 410a. The supply pipe 431a is connected to the lower area 402a. The liquid containing gases flows through the passage 432a. The passage 432a is connected to the lower area 402a.

The supply plate 435a partitions the space of the container 410a into an upper area 401a and a lower area 402a. The supply plate 435a is situated in the interior of the container 410a. As an example, the supply plate 435a is a circular plate. The supply plate 435a is situated to be parallel to the upper surface and the lower surface of the container 410a. The supply plate 435a has a plurality of supply holes 436a. The supply holes 436a supply the micro bubbles B generated by the lower area 402a to the upper area 401a.

The bubble generator 433a generates micro bubbles B. The bubble generator 433a generates micro bubbles B by rotating the liquid supplied through the passage 432a at high speed. The bubble generator 433a is situated in the lower area 402a. As an example, the bubble generator 433a may be an apparatus that may be rotated at high speed and has a propeller.

As an example, the micro bubbles B generated by the bubble generator 433a may be oxygen. In contrast, the micro bubbles B may be an inert gas. As an example, the inert gas may be nitrogen gas, argon gas, or helium gas. The micro bubbles B generated by the bubble generator 433a may have a size of 50 micrometers or less.

The dissolved ozone removal unit 400b of FIG. 6 includes a container 410b, a bubble supply member 430b, an exhaust member 450b, an inlet pipe 460b, and an outlet pipe 470b. The container 410b, the exhaust member 450b, the inlet pipe 460b, and the outlet pipe 470b of FIG. 6 may be substantially the same as the container 410, the exhaust member 450, the inlet pipe 460, and the outlet pipe 470 of the dissolved ozone removable unit 400 FIG. 4.

The bubble supply member 430b supplies bubbles into the space 401b in the container 410b. The bubble supply member 430b includes a supply pipe 431b and a bubble generator 433b.

The supply pipe 431b is connected to an upper wall of the container 410b. The supply pipe 431b extend to a lower area in the container 410b. A passage 432b is formed in the interior of the supply pipe 431b. The liquid containing gases flows through the passage 432b. The passage 432b has a circular cross-section. The passage 432b is connected to the space 401b of the container 410b. The supply pipe 431b situated in the lower area in the container 410b has a supply hole 434b through which micro bubbles G are generated and are supplied to the liquid in the container 410b. A plurality of supply holes 434b are provided.

The bubble generator 433b generates micro bubbles B. The bubble generator 433b is situated in the passage 432b. The bubble generator 433b generates micro bubbles B by rotating the liquid flowing in the passage 432b at high speed. As an example, the bubble generator 433b may be an apparatus that may be rotated at high speed and has a propeller. The micro bubbles B generated by the bubble generator 433b are supplied to a lower area in the container 410b via the passage 432b in the supply pipe 431b.

As an example, the micro bubbles B generated by the bubble generator 433b may be oxygen. In contrast, the micro bubbles B may be an inert gas. As an example, the inert gas may be nitrogen gas, argon gas, or helium gas. The micro bubbles B generated by the bubble generator 433b may have a size of 50 micrometers or less.

Figure 7:
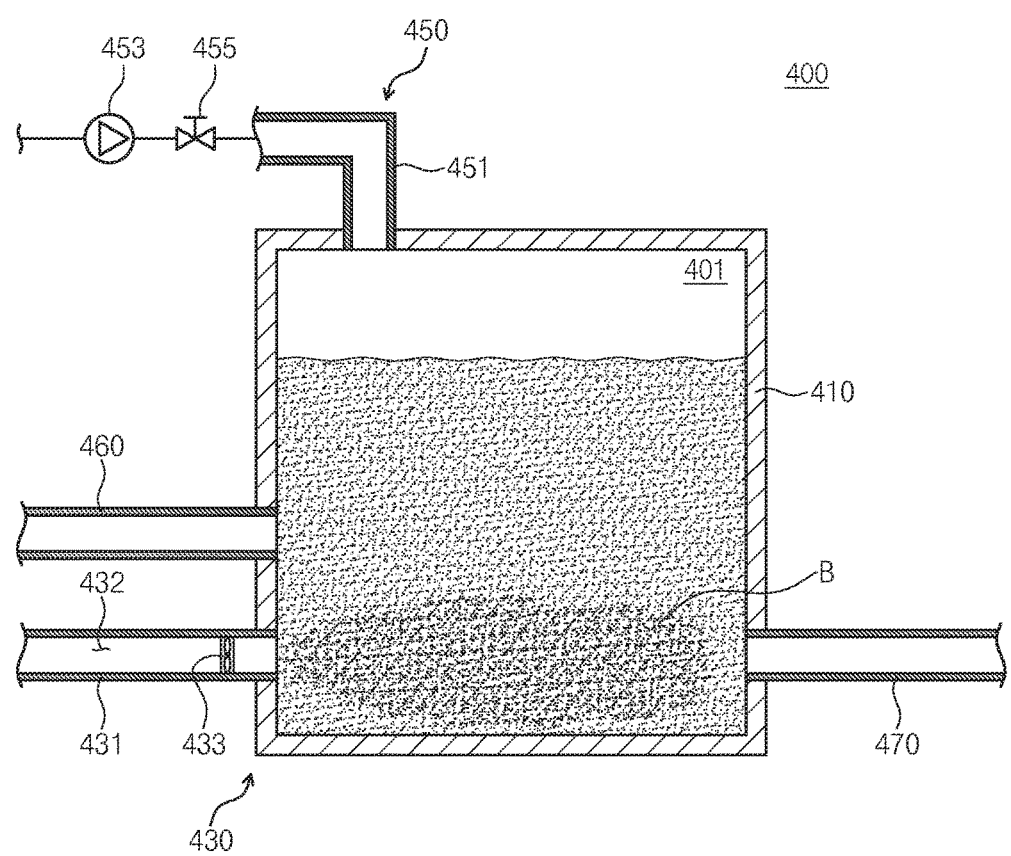
FIGS. 7 to 9 are views schematically illustrating the method of removing dissolved ozone according to an embodiment of the inventive concept.
Figure 8:
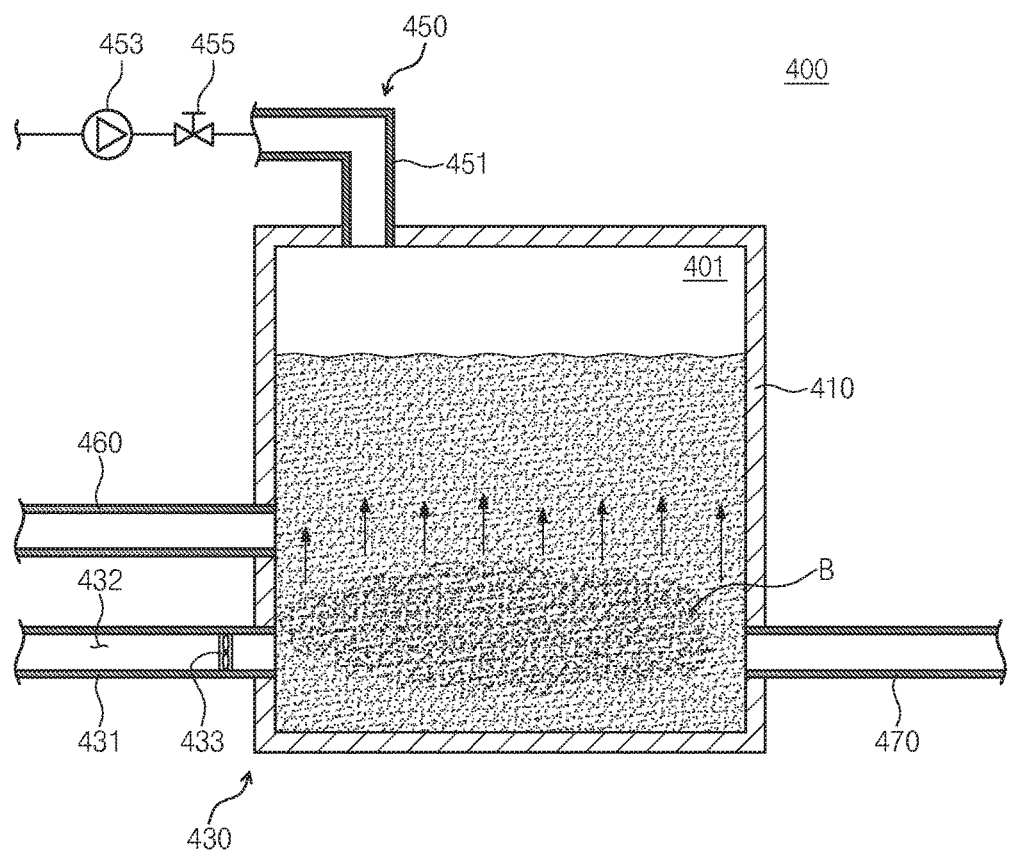
Figure 9:
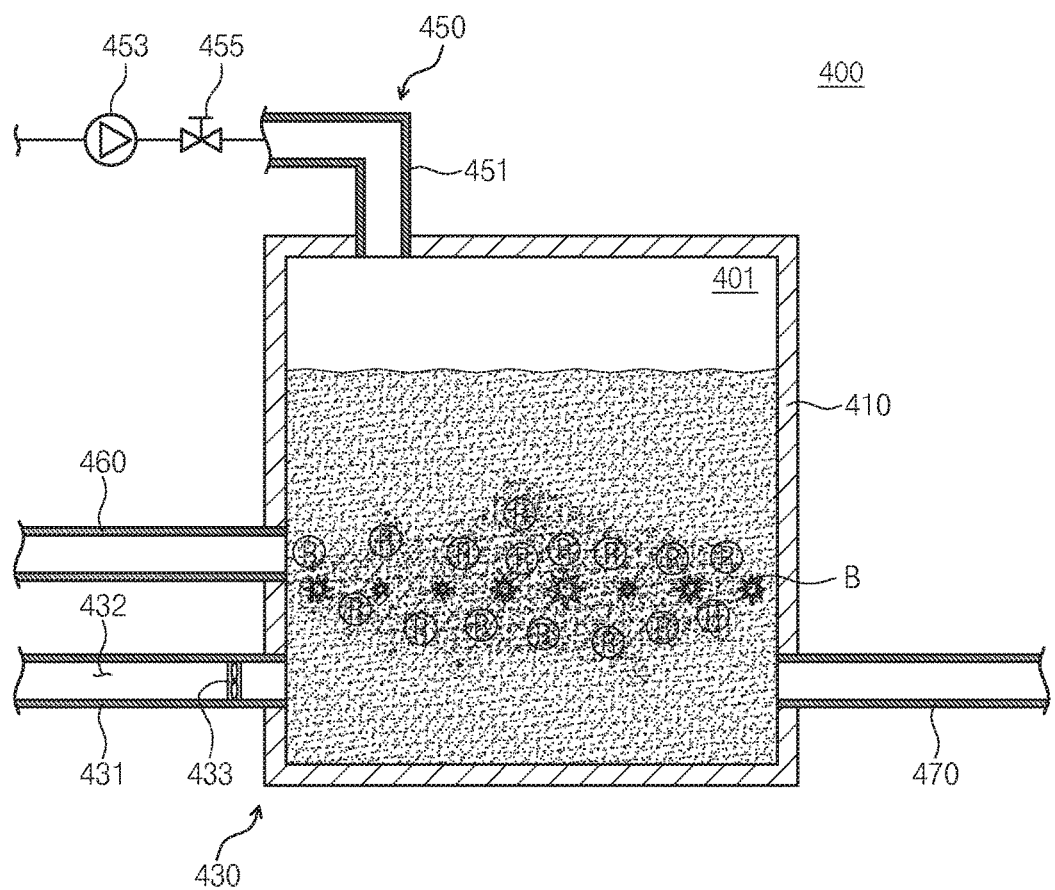

Hereinafter, a method of removing dissolved ozone $O_3$ in liquid will be described. In the embodiment, water will be exemplified as the liquid. FIGS. 7 to 9 are views schematically illustrating the method of removing dissolved ozone according to an embodiment of the inventive concept. Hereinafter, referring to FIGS. 7 to 10, liquid is accommodated in the interior of the container 410. Micro bubbles B are generated by using the bubble generator 433 and are supplied to the liquid in the container 410 through the supply pipe 431. The micro bubbles B are supplied to a lower area of the liquid as in FIG. 7.

The micro bubbles B supplied into the liquid have fine sizes. As an example, the micro bubbles B have an average size of 50 micro meters or less. Because the sizes of the micro bubbles B are fine, buoyancy is applied to the micro bubbles B in the liquid so that the micro bubbles are slowly moved to the upper side of the liquid as in FIG. 8. Meanwhile, because the micro bubbles B are small, the buoyancies of the micro bubbles B is not high so that the micro bubbles B are lifted slowly. As an example, the lifting speed of the micro bubbles B may be 4 mm/min.

The sizes of the lifted micro bubbles B become gradually smaller as a pressure is applied from the surrounding liquid to the micro bubbles B. As the sizes of the micro bubbles B become gradually smaller, the internal pressures of the micro bubbles B continue to increase so that the micro bubbles B disappear after a predetermined time period as in FIG. 9. Then, because the internal pressures of the micro bubbles are very high, much energy is supplied to the liquid when the micro bubbles B disappear. In the process, radical ions R are generated when the ions in the water are pulled to the surfaces of the micro bubbles B and then are exploded due to the electrostatic characteristics. The generated radical ions R react with ozone to generate water and oxygen, and the dissolved ozone is removed.

Unlike the existing methods, the method of removing dissolved ozone by using micro bubbles B is a method that uses micro bubbles including oxygen and an inert gas and may effectively remove the dissolved ozone $O_3$ in the liquid.

Figure 10:
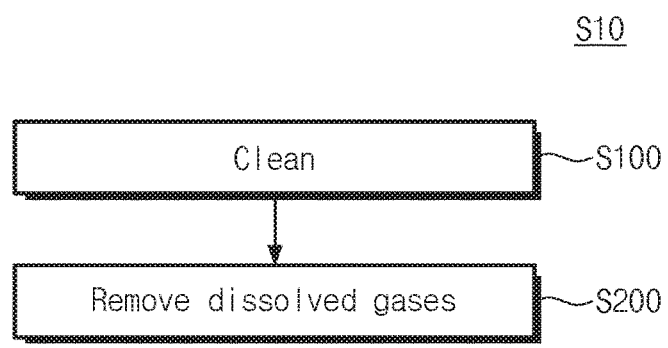
FIG. 10 is a flowchart sequentially illustrating a method of cleaning a substrate according to an embodiment of the inventive concept.

Hereinafter, a method of cleaning a substrate will be described. FIG. 10 is a flowchart sequentially illustrating a method S10 of cleaning a substrate according to an embodiment of the inventive concept. Hereinafter, referring to FIG. 10, the method S10 of cleaning a substrate may include a cleaning operation S100 and a dissolved ozone removing operation S200.

The cleaning operation S100 is an operation of cleaning a substrate by supplying a cleaning liquid containing ozone to a substrate. As an example, the cleaning liquid may be ozone water containing ozone of high concentration.

The dissolved ozone removing operation S200 is an operation of removing dissolved ozone $O_3$ in the cleaning liquid. As an example, in the operation S200 of removing dissolved ozone, the dissolved ozone $O_3$ in the cleaning liquid may be removed by supplying the micro bubbles B to the cleaning liquid. The method of removing dissolved ozone $O_3$ by using micro bubbles B is the same as the method of removing dissolved ozone $O_3$ in liquid.

Although it has been described that the liquid is water in the above example, the liquid may be any liquid in which dissolved ozone $O_3$ is dissolved.

According to an embodiment of the inventive concept, dissolved ozone in liquid can be removed by supplying micro bubbles to the liquid.

The effects of the inventive concept are not limited to the above-mentioned effects, and the unmentioned effects can be clearly understood by those skilled in the art to which the inventive concept pertains from the specification and the accompanying drawings.

The above description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A method of removing dissolved ozone from a treating solution for a semiconductor substrate, the method comprising:
    treating a semiconductor substrate with a treating solution including dissolved ozone;
    collecting the treating solution after the treating solution has treated the semiconductor substrate;
    rotating a propeller to rotate a solution containing a gas to supply micro bubbles to a container containing the treating solution, which is different from the solution, where the micro bubbles become smaller in size and explode while moving up in the treating solution; and
    providing an exhaust pressure to discharge ozone, which exits from the treating solution by radical ions that are generated as a result of energy generated from explosion of the micro bubbles in the treating solution.

2. The method of claim 1, wherein the micro bubbles are supplied to a lower area of the container in the treating solution.

3. The method of claim 1, wherein the gas includes oxygen.

4. The method of claim 1, wherein the gas includes an inert gas.

5. The method of claim 3, wherein the micro bubbles have an average size of at most 50 micrometers.

6. The method of claim 4, wherein the solution is water, and the inert gas comprises nitrogen, argon, or helium gas.

* * * * *